(12) United States Patent
Kim

(10) Patent No.: US 6,258,691 B1
(45) Date of Patent: Jul. 10, 2001

(54) CYLINDRICAL CAPACITOR AND METHOD FOR FABRICATING SAME

(75) Inventor: Yun-Gi Kim, Wonju-shi (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/350,104

(22) Filed: Jul. 9, 1999

(30) Foreign Application Priority Data

Jul. 16, 1998 (KR) ................................................ 98-28822

(51) Int. Cl.[7] .................................................. H01L 21/20
(52) U.S. Cl. .......................................................... 438/398
(58) Field of Search ..................... 438/398, 396, 438/307, 573, 255, 240, 605, 253, 254, 665, 964, 482

(56) References Cited

U.S. PATENT DOCUMENTS

| 5,340,763 | 8/1994 | Dennison | 437/52 |
| 5,340,765 | 8/1994 | Dennison | 437/52 |
| 5,444,005 | * 8/1995 | Kim et al. | 437/52 |
| 6,090,679 | * 7/2000 | Lou | 438/396 |

* cited by examiner

Primary Examiner—Matthew Smith
Assistant Examiner—Calvin Lee
(74) Attorney, Agent, or Firm—The Law Offices of Eugene M. Lee, PLLC

(57) ABSTRACT

A method for fabricating a cylindrical capacitor that exceeds photolithographic resolution. The capacitor is formed by partially etching the storage node opening, thereby reducing the distance between adjacent openings defined by the photolithographic process. The openings defined by the photolithographic process is enlarged by wet etching the sidewalls of the openings by at least the same thickness as that of a subsequently formed conductive layer for storage node formation. Contact plugs that are electrically connected to the bottom of the cylindrical storage nodes protrude from the top surface of an insulating layer in order to increase process margins and decrease contact resistance.

26 Claims, 15 Drawing Sheets

CYLINDRICAL CAPACITOR AND METHOD FOR FABRICATING SAME

BACKGROUND OF THE INVENTION

1. Field of the Invention

The present invention relates to semiconductor devices and a method for fabricating them and, more particularly, to a method for fabricating DRAM (Dynamic Random Access Memory) cell capacitors that can be used in high-density integrated circuits.

2. Description of the Related Art

As the cell density of DRAM devices increases, there is a continuous need to maintain a sufficiently high storage capacitance despite decreasing cell area. Additionally, there is a continuous need to further reduce the cell area. In order to keep the capacitance of storage capacitors in DRAMs at an acceptable value, many methods have been studied and developed. One approach is to use a film with a high dielectric constant such as BST (barium strontium titanate) for the storage electrode in the capacitors instead of conventional NO (Nitride Oxide) or ONO (Oxide Nitride Oxide) dielectric films. The use of high-dielectric-constant films, however, is still being studied and tested and there are problems relating to reliability.

An alternative approach is to form three dimensional capacitors such as stacked capacitors in order to increase available surface area. Such stacked capacitors include, for example, double-stacked, fin stacked, cylindrical, spread-stacked, or box structure capacitors.

Because both outer and inner surfaces of a cylindrical capacitor can be utilized as effective capacitor ares, the cylindrical structure is favorable for integrated circuit memory cells such as DRAM cells among the three-dimensional stacked capacitors.

U.S. Pat. No. 5,340,765 (issued on Aug. 23, 1994) discloses a method for fabricating a capacitor structure resembling a cylindrical container. U.S. Pat. No. 5,340,763 (issued on Aug. 23, 1994) discloses more complex structures, such as the container-within container and multiple pin structures.

Recently, new technologies have been developed for further increasing the effective surface area of DRAM cells by modifying the surface morphology of the polysilicon storage node itself. This is accomplished by engraving or controlling the nucleation and growth condition of polysilicon. A hemispherical grain (HSG) silicon layer can be deposited over a storage node to increase surface area and capacitance.

One problem associated with a capacitor having a HSG silicon layer is the formation of electrical bridges between adjacent storage nodes. Furthermore, high density DRAM devices leave only a little space for the storage nodes of a memory cell, making it difficult to employ HSG silicon in the inner surface of cylindrical capacitors and resulting in electrical bridges between opposite HSG silicon layers within the cylinder, particularly with respect to the shortest direction of cylindrical capacitors.

More specifically, in 256M DRAMs of a 170 nm design rule, a cylindrical capacitor with a HSG silicon layer has a minimum feature size of 170 nm in the shortest direction. At this time, a HSG frame conductive layer is required be at least 40 nm thick, and a HSG is about 30 nm thick. The overall thickness of the storage node having a HSG silicon layer becomes about 140 mn. Because a dielectric film is about 8 nm thick and a plate node is about 30 nm thick, it is very different to form a dielectric film and a plate node subsequently. That is, the overall dimension of layers deposited in the cylindrical opening in the shortest direction is about 216 nm, which exceeds the design rule of 170 nm. Accordingly, it has heretofore been impossible to form a HSG silicon layer in compliance with a design rule of 170 mn.

SUMMARY OF THE INVENTION

A feature of the present invention is to provide a method for fabricating a cylindrical capacitor having a HSG silicon layer on its inner surface in a high density integrated circuit device.

Another feature of the present invention is to form a cylindrical capacitor with a HSG silicon layer on its inner surface in order to increase the available surface area, so that a relaxed design rule in photolithographic processes can be employed by enlarging openings for storage node formation defined by the photolithographic processes by wet etching. The distance between adjacent storage nodes can be reduced to a minimum pitch of about 10 nm.

Another feature of the present invention is to form a contact plug that protrudes from the top surface of an insulating layer in which the contact plug is buried in order to reinforce the support of subsequently formed storage nodes.

According to one aspect of the present invention, a method for fabricating a DRAM cell capacitor is provided, comprising the steps of forming a moulding layer on an integrated circuit substrate, the moulding layer having an opening for a storage node, enlarging the opening by etching both sidewalls of the opening by a predetermined thickness, forming a conductive layer for the storage node in the enlarged opening and on the moulding layer, forming an insulating layer on the conductive layer to completely fill the enlarged opening, and planarizing the insulating layer and the conductive layer until the top surface of the moulding layer is exposed.

The may further comprise the steps of forming HSG silicon nodules on the conductive layer prior to the step of forming the insulating layer, removing at least the remainder of the insulating layer in the enlarged opening subsequent to the step of planarizing the insulating layer to form a storage node, and forming a dielectric layer and a plate node to form the capacitor.

Alternatively, the method may further comprise the steps of removing the insulating layer in the enlarged opening subsequent to the step of planarizing the insulating layer and the conductive layer, forming HSG silicon nodules on the storage node, and forming a dielectric layer and a plate node to form a capacitor. In this alternate case, the method may still further comprise the step of removing the moulding layer subsequent to the step of forming the HSG silicon nodules.

In another aspect of the present invention, a method for fabricating a DRAM cell capacitor is provided, comprising the steps of forming a first insulating layer on an integrated circuit substrate, selectively etching the first insulating layer to form a contact hole, filling the contact hole with conductive material to form a contact plug, forming a moulding layer on the first insulating layer and on the contact plug, the moulding layer having an opening that exposes at least a top surface of the contact plug and a part of the first insulating layer outside the boundary of the contact plug, enlarging the opening by etching both sidewalls of the opening by a predetermined thickness, forming a conductive layer in the enlarged opening and on the moulding layer, forming HSG silicon nodules on the conductive layer, forming a second insulating layer on the HSG silicon nodules and on the conductive layer to completely fill the enlarged opening, and thereafter planarizing the second insulating layer, the HSG silicon nodules and the conductive layer until the surface of the moulding layer is exposed.

In still another aspect of the present invention, a method for fabricating a DRAM cell capacitor is provided, comprising the steps of forming a first insulating layer on an integrated circuit substrate, selectively etching the first insulating layer to form a contact hole, filling the contact hole with conductive material to form a contact plug, forming a moulding layer on the first insulating layer and on the contact plug, the moulding layer having an opening that exposes at least a top surface of the contact plug and the first insulating layer outside the boundary of the contact plug, enlarging the opening by etching both sidewalls of the opening by a predetermined thickness, forming a conductive layer in the enlarged opening and on the moulding layer, forming a second insulating layer on the conductive layer to completely fill the enlarged opening, the second insulting layer having an etching selectivity with respect to the moulding layer, planarizing the second insulating layer and the conductive layer until the surface of the moulding layer is exposed, removing the remainder of the second insulating layer in the enlarged opening to form a storage node, and forming HSG silicon nodules on the surface of the storage node.

In still another aspect of the present invention, a method for fabricating a DRAM cell capacitor is provided, comprising the steps of forming a first insulating layer at least including a nitride layer and an oxide layer on an integrated circuit substrate, selectively etching the first insulating layer to form a contact hole, filling the contact hole with conductive material to form a contact plug, forming a moulding layer on the first insulating layer and on the contact plug, the moulding layer having an opening that exposes at least the top surface of the contact plug and the first insulating layer outside the boundary of the contact plug, enlarging the opening by etching both sidewalls of the opening by a predetermined thickness, forming a conductive layer in the enlarged opening and on the moulding layer, forming HSG silicon nodules on the conductive layer, forming a second insulating layer in the remainder of the enlarged opening and on the conductive layer, a void being formed in the enlarged opening when forming the second insulating layer, and thereafter planarizing the second insulating layer, the HSG silicon nodules and the conductive layer until the surface of the moulding layer is exposed.

In yet another aspect of the present invention, a method for fabricating a DRAM cell capacitor is provided, comprising the steps of forming a first insulating layer and a first anti-reflection layer on an integrated circuit substrate, selectively etching the first anti-reflection layer and the first insulating layer to form a contact hole, filling the contact hole with a conductive material to form a contact plug, forming a moulding layer and a second anti-reflection layer on the first anti-reflection layer and on the contact plug, etching the second anti-reflection layer and the moulding layer to form an opening that exposes at least the top surface of the contact plug and the first anti-reflection layer outside the boundary of the contact plug, removing at least the second anti-reflection layer and the first anti-reflection layer in the opening, enlarging the opening by etching both sidewalls of the opening by a predetermined thickness, forming a conductive layer in the enlarged opening and on the moulding layer, forming HSG silicon nodules on the conductive layer, forming a second insulating layer to completely fill the enlarged opening, and planarizing the second insulating layer, the HSG silicon nodules and the conductive layer until the surface of the moulding layer is exposed.

In still another aspect of the present invention, a method for fabricating a DRAM cell capacitor is provided, comprising the steps of forming a first insulating layer and a first anti-reflection layer on an integrated circuit substrate, selectively etching the first anti-reflection layer and the first insulating layer to form a contact hole, filling the contact hole with conductive material to form a contact plug, forming a moulding layer and a second anti-reflection layer on the first anti-reflection layer and on the contact plug, etching the second anti-reflection layer and the moulding layer to form an opening that exposes at least the top surface of the contact plug and the first anti-reflection layer outside the boundary of the contact plug, removing at least the second anti-reflection layer and the first anti-reflection layer in the opening, enlarging the opening by etching both sidewalls of the opening by a predetermined thickness, forming a conductive layer in the enlarged opening and on the moulding layer, forming HSG silicon nodules on the conductive layer, forming a second insulating layer in the remainder of the enlarged opening and on the conductive layer, a void being formed in the enlarged opening when forming the second insulating layer, and thereafter planarizing the second insulating layer, the HSG silicon nodules and the conductive layer until the surface of the moulding layer is exposed.

In still another aspect of the present invention, a DRAM cell capacitor is provided, comprising an insulating layer formed on an integrated circuit substrate, a storage node formed on the insulating layer and electrically connected to the substrate via a contact plug formed in the insulating layer, the storage node being separated from adjacent storage nodes by a minimum distance of about 10 nm, HSG silicon nodules formed on the storage node, a dielectric film formed on the storage node and the HSG silicon nodules, and a plate node formed on the dielectric film.

In still another aspect of the present invention, a DRAM cell capacitor is provided, comprising an insulating layer formed on an integrated circuit substrate, the insulating layer including a contact hole, a contact plug filling the contact hole and protruding by a predetermined thickness from the top surface of the insulating layer, a storage node formed on the insulating layer and electrically connected to the contact plug, a dielectric film formed on the storage node and on the insulating layer, and a plate node formed on the dielectric film, wherein the storage node is separated from adjacent storage nodes by a minimum distance of about 10 nm.

BRIEF DESCRIPTION OF THE DRAWINGS

The above features and advantages of the invention will become apparent upon reference to the following detailed description of specific embodiments and the attached drawings, of which.

DESCRIPTION OF SPECIFIC EMBODIMENTS

Figure 1A:
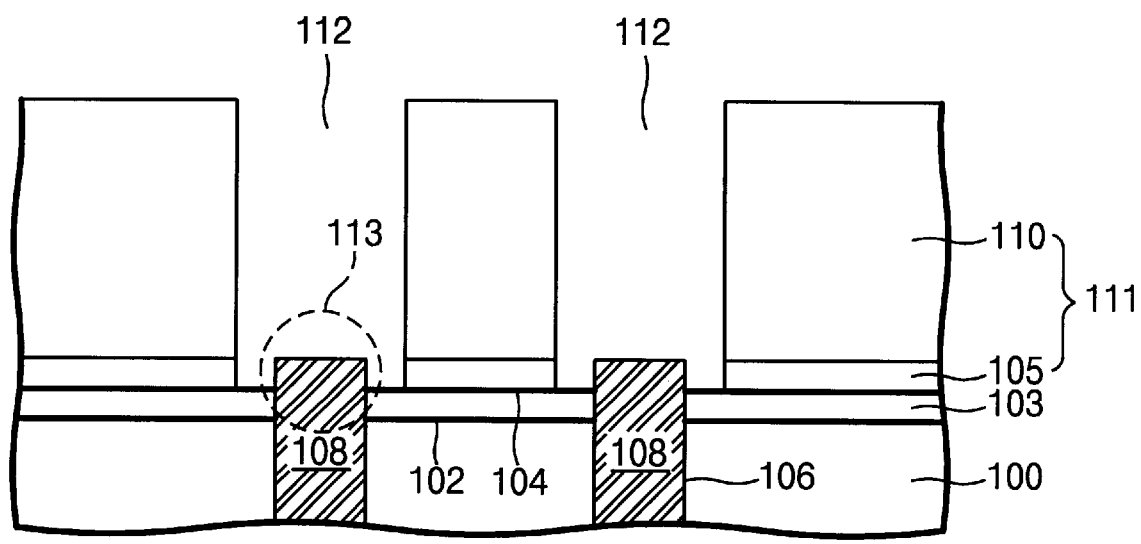
FIGS. 1A to 1E are cross-sectional views of a semiconductor substrate in selected stages of the process steps for forming a DRAM cell capacitor according to a first embodiment of the present invention.

Korean patent application no. 98-28822, filed Jul. 16, 1998, is hereby incorporated by reference as if fully set forth herein. Specific embodiments of the present invention are shown in the accompanying drawings and the description below. The present invention may, however, be embodied in different forms and should not be construed as limited to the embodiments set forth herein.

In the drawings, the thickness of layers and regions are exaggerated for clarity. It will also be understood that when a layer is referred to as being "on" another layer or substrate, it can be directly on the other layer or substrate, or intervening layers may also be present. Moreover, each embodiment described and illustrated herein includes its complementary conductivity type embodiment as well.

First Embodiment

Figure 1B:
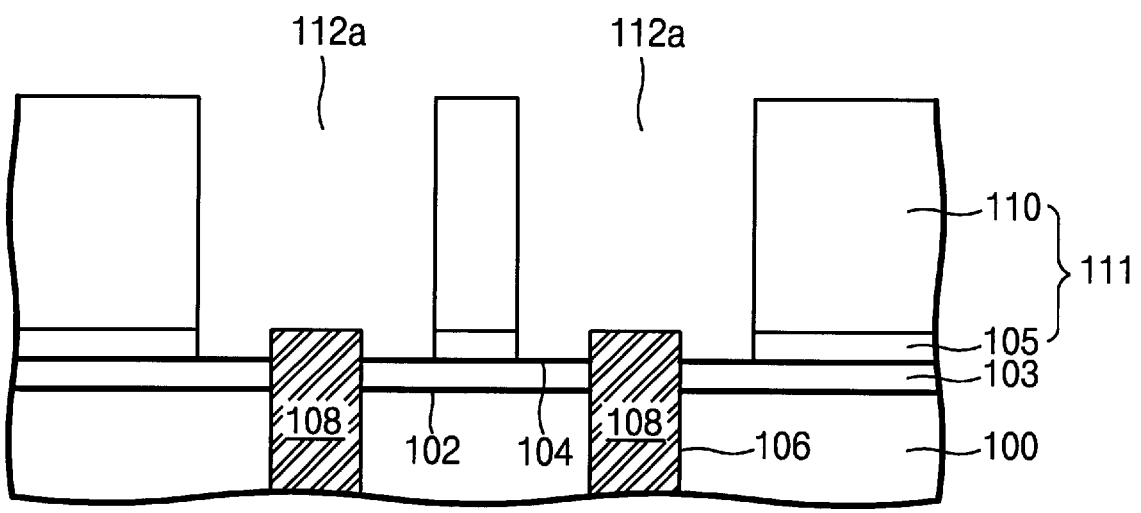
Figure 1C:
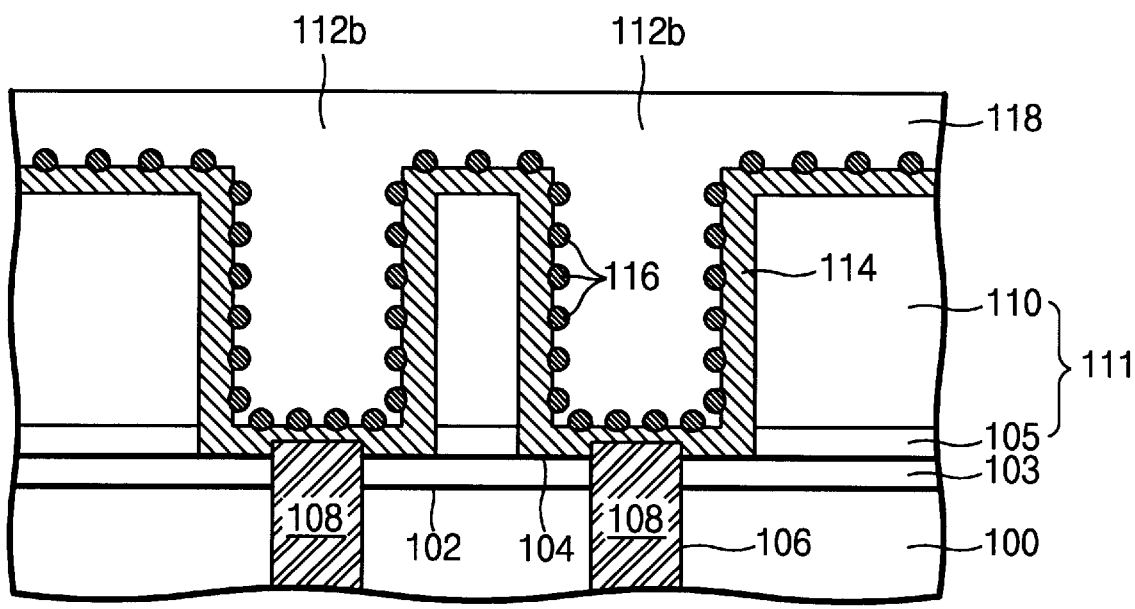
Figure 1D:
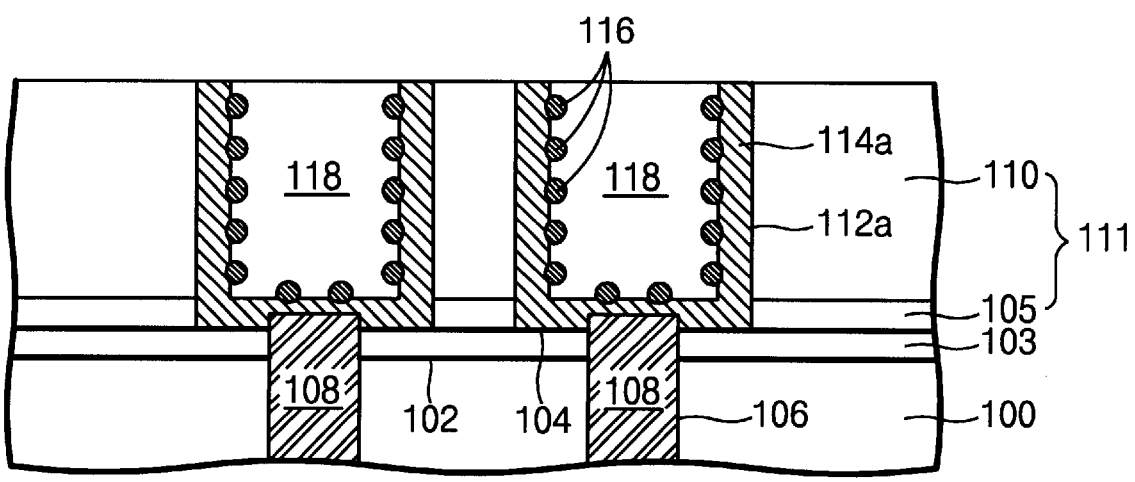

FIGS. 1A to 1E schematically show cross-sectional views of a semiconductor substrate in selected stages of the process steps for forming a DRAM cell capacitor according to a first embodiment of the present invention. FIG. 2 shows a layout diagram of a DRAM cell capacitor according to the first embodiment of the present invention.

Figure 1E:
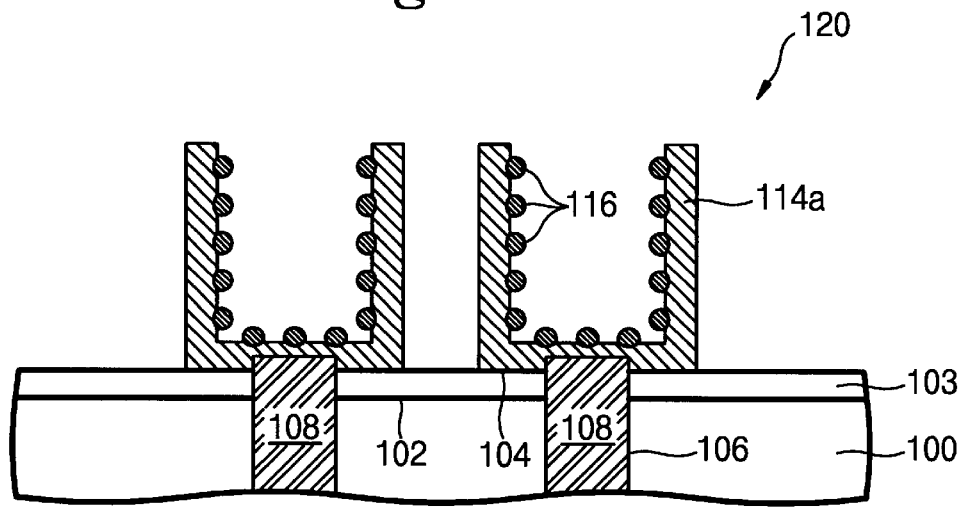
Figure 2:
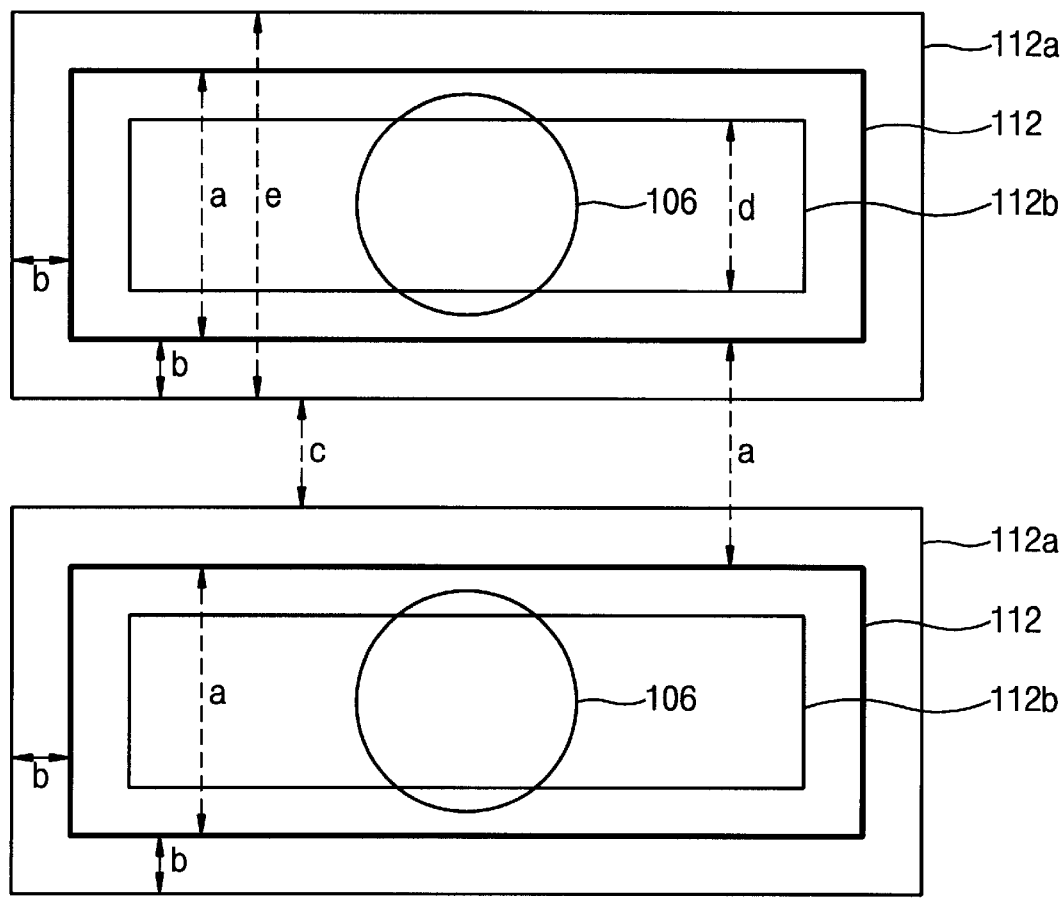
FIG. 2 schematically shows a layout diagram of a DRAM cell capacitor according to the first embodiment of the present invention.

Referring to FIG. 1E, the structure of a cylindrical storage node 120 is schematically shown. The cylindrical storage node 120 includes HSG silicon nodules 116 on the inner surfaces of cylinders. The cylindrical storage node 120 is electrically connected to an active region of an integrated circuit substrate (not shown in drawings) via a contact plug 108 in insulating layers 100, 102, 103 and 104. The insulating layers are formed by alternating oxide layers 100, 103 and nitride layers 102, 104. The contact plug 108 protrudes from the top surface of the nitride layer 104. Therefore, the storage node 120, which is formed on the contact plug 108 and on the nitride layer 104 in areas outside the boundary of the contact plug 108, has an increased contact area with the contact plug 108. Thus, contact resistance is reduced and the support of the storage node 120 is reinforced.

The HSG silicon nodules 116 are formed only on the inner surfaces of the cylinders. Therefore, electrical bridges between adjacent storage nodes can be avoided and also the distance between adjacent storage nodes can be minimized.

Formation of the storage node 120 will be described with reference to FIGS. 1A to 1E. The present invention relates to a method for fabricating a DRAM cell capacitor. The process for forming a field oxide layer and a transistor structure as presently practiced in manufacturing DRAM cells are only briefly described to the extent that it helps in understanding the present invention.

First, an integrated circuit substrate (not shown) is provided. A field oxide layer is formed on the substrate to define active and inactive regions. The active regions are the regions to which electrical connection is to be made. The field oxide layer may be formed by shallow trench isolation or by local oxidation of silicon. Transistors are formed on predetermined regions of the substrate according to conventional methods.

An interlayer insulating layer 100 having bit lines (not shown in drawings) therein is formed on the substrate. Although not shown, the bit lines are electrically connected to predetermined active regions. A silicon nitride layer and an oxide layer are formed on the interlayer insulating layer 100 alternately. That is, a silicon nitride layer 102 is deposited on the interlayer insulating layer 100 and then an oxide layer 103 is deposited thereon. Another silicon nitride layer 104 is then formed on the oxide layer 103 and another oxide layer 105 is formed on the silicon nitride layer 104. Each silicon nitride layer 102, 104 is about 30 Å to 500 Å thick. The silicon nitride layer 102 serves to prevent the oxidation of the bit lines during oxidation processes.

Contact holes 106 are opened in the alternating layers 102, 103, 104, 105 and the interlayer insulating layer 100 to expose the predetermined active regions of the substrate. Conductive material is deposited to fill the contact holes 106 and then planarized to form contact plugs 108. The conductive material comprises polysilicon, titanium nitride, titanium, tungsten, tungsten silicide and/or all combinations thereof. This list of conductive material is not intended to be exhaustive and is merely an example. The planarization comprises an etch back process.

An oxide layer 110 such as PE-TEOS (Plasma Enhanced Chemical Vapor Deposition Tetraethyl Orthosilicate) is then deposited on the contact plugs 108 and on the oxide layer 105. The thickness of the oxide layer 110 determines the height of a subsequently formed storage node. The oxide layers 110 and 105 is used as a moulding layer 111 for storage node formation. Using photolithographic processes of a design rule of 170 nm, the moulding oxide layers are selectively etched with respect to the contact plugs 108 and the nitride layer 104.

Thus, openings 112 for storage nodes are formed, and the contact plug 108 protrudes from the top surface of the nitride layer 104 as shown by reference numeral 113 in FIG. 1A. Due to the protruding contact plug 108, the contact area with the subsequently formed storage nodes can be increased and the overlay margin of the contact plugs 108 can be increased.

As shown in FIG. 2, the openings 112 have a dimension of "a" (of about 170 nm) measured at the shortest direction thereof, which is same as the distance between adjacent openings. That is, the distance between adjacent openings 112 is same as the dimension "a" of the openings 112 in the shortest direction. The dimension "a" corresponds to the design rule of the photolithographic processes for storage node formation.

Referring to FIG. 1B, both sidewalls of the openings 112 are partially etched to enlarge the dimension thereof, thereby forming enlarged openings 112a and reducing the distance between adjacent openings 112a. The sidewalls of the openings 112 are etched at least to an amount or degree as the amount of thickness of the subsequently formed conductive layer for storage nodes by a wet etching process. For example, at least about 40 nm of the sidewalls is etched. As shown in FIG. 2, the dimension of the openings is increased from "a" to "e", thereby decreasing the distance between adjacent openings from "a" to "c". A distance between adjacent openings that exceeds the design rule can be formed according to this method, and also the surface area of the storage nodes can be increased due to enlarged openings.

Referring to FIG. 1C, a conductive layer 114 for storage nodes is deposited in the enlarged opening 112a and on the moulding layer 111 according to the topology of the enlarged opening 112a to a thickness of at least 40 nm. The thickness 40 nm is a minimum thickness required for HSG silicon growth thereon. The conductive layer is made of amorphous silicon. HSG silicon nodules 116 are then formed on the conductive layer 114 by any suitable conventional method. As shown in FIG. 2, the openings 112b resulting from the deposition of the conductive layer 114 and the formation of HSG silicon nodules 116 have a dimension of "d" in the shortest direction.

Referring to FIG. 1D, a planarization oxide layer 118 such as PE-TEOS is then deposited on the conductive layer 114 and HSG silicon nodules 116 to completely fill the remainder of the openings 112b. Such oxide layer 118 serves to protect against the contamination of the HSG silicon nodules 116 and the conductive layer 114 during a subsequent planarization process.

For electrical insulation between adjacent storage nodes, a planarization process such as CMP (Chemical Mechanical Polishing) is carried out down to the moulding layer 111, thereby forming storage nodes 114a as shown in FIG. 1D.

Referring to FIG. 1E, the planarization oxide layer 118 and the moulding layer 111 are selectively etched by using the silicon nitride layer 104 as an etch-stop layer. Thus, storage nodes 114a having HSG silicon nodules 116 on the inner surface thereof are completely formed. The etching of the planarization oxide layer 118 and the moulding layer 111 is conducted using a wet chemical such as BOE (Buffered Oxide Etchant). Subsequently, high concentration $PH_3$ annealing is carried out to dope the storage nodes 114a. Subsequently, a dielectric film (not shown) and a top plate (not shown) are formed, thereby forming a cylindrical capacitor.

In conventional 256M DRAMs of a 170 mn design rule, a cylindrical capacitor with HSG silicon has a minimum feature size of 170 nm in its shortest direction. In this case, a HSG frame conductive layer is at least 40 nm thick and a HSG about 30 nm thick. The overall thickness of the storage node becomes about 140 nm (=2×40 nm+2×30 nm).

Therefore, it is very difficult to form a dielectric film and a plate node subsequently. Because a dielectric film is about 8 nm thick and a plate node is about 30 nm thick, the overall dimension of layers deposited in the cylindrical opening in its shortest direction is about 216 nm (=140+30×2+8×2), which exceeds the design rule of 170 nm. Accordingly, it is impossible to form HSG silicon in compliance with the design rule of 170 nm.

However, in accordance with the present invention, the opening 112 for storage node formation defined by a design rule of 170 nm is enlarged by wet etching by a thickness of at least 40 nm or more, for example, 70 nm. More specifically, the dimension "a" of 170 nm of the openings 112, which is defined by a photolithographic process, can be enlarged to the dimension "e" of 310 nm by etching the sidewalls of the openings 112 by about 70 nm ("b" in FIG. 2) (170 nm+70 nm×2=310 nm). Accordingly, there is sufficient margin for subsequent formation of HSG frame conductive layer (about 40 nm), HSG formation (about 30 nm), dielectric deposition (about 8 nm) and plate node formation (about 30 nm). About 90 nm or more of a margin remains even after completing the formation of the storage node, the HSG silicon, the dielectric film, and the plate node.

At this time, the distance between adjacent openings is reduced from "a" (170 nm) to "c". The distance "c" can be reduced to about 10 nm, preferably from about 20 nm to 100 nm. Accordingly, this method advantageously can be applied to higher density integrated circuit devices.

Furthermore, if misalignment between the openings and the contact plugs occur, there are little problems associated with misalignment because the openings are enlarged by wet etching according to the present invention.

Also, the capacitance of the cylindrical capacitor according to the present invention is increased as compared with a conventional simple cylindrical capacitor without HSG silicon in a given design rule. More specifically, a conventional simple cylindrical capacitor with a 170 nm design rule has a capacitance from about 21 fF/cell ($C_{min}$) to 25 fF/cell ($C_{max}$) with TaO dielectric and from about 13 fF/cell ($C_{min}$) to 15 fF/cell ($C_{max}$) with NO (Nitride Oxide) dielectric. On the other hand, a capacitor with HSG silicon nodules according to the present invention has a capacitance from about 35 fF/cell ($C_{min}$) to 42 fF/cell ($C_{max}$) with TaO dielectric and from about 30 fF/cell ($C_{min}$) to 35 fF/cell ($C_{max}$) with NO (Nitride Oxide) dielectric, respectively. Therefore, the cylindrical capacitors according to the present invention have sufficient capacitance (at least about 28 fF/cell) required for reliable device performance.

Second Embodiment

A second embodiment of the present invention will be described with reference to FIGS. 3A to 3D. In FIGS. 3A to 3D, same parts that are functioning in FIGS. 1A to 1E are identified by same reference numerals and the explanation thereof is omitted. The significant difference between the first and second embodiments is that an etching barrier layer is formed in the second embodiment so as to protect HSG silicon nodules during a pre-cleaning process.

Figure 3A:
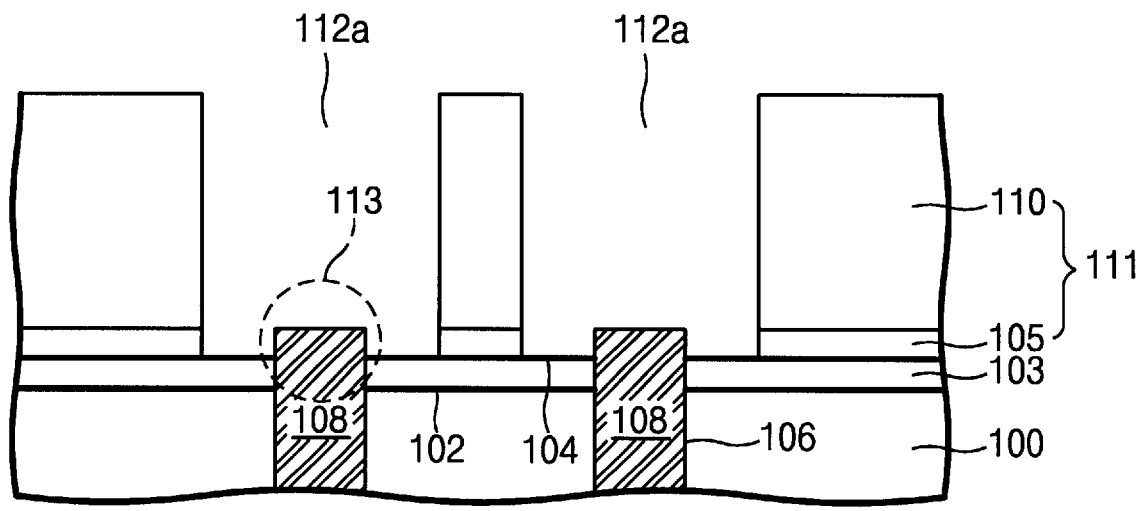
FIGS. 3A to 3D are cross-sectional views of a semiconductor substrate in selected stages of the process steps for forming a DRAM cell capacitor according to a second embodiment of the present invention.
Figure 3B:
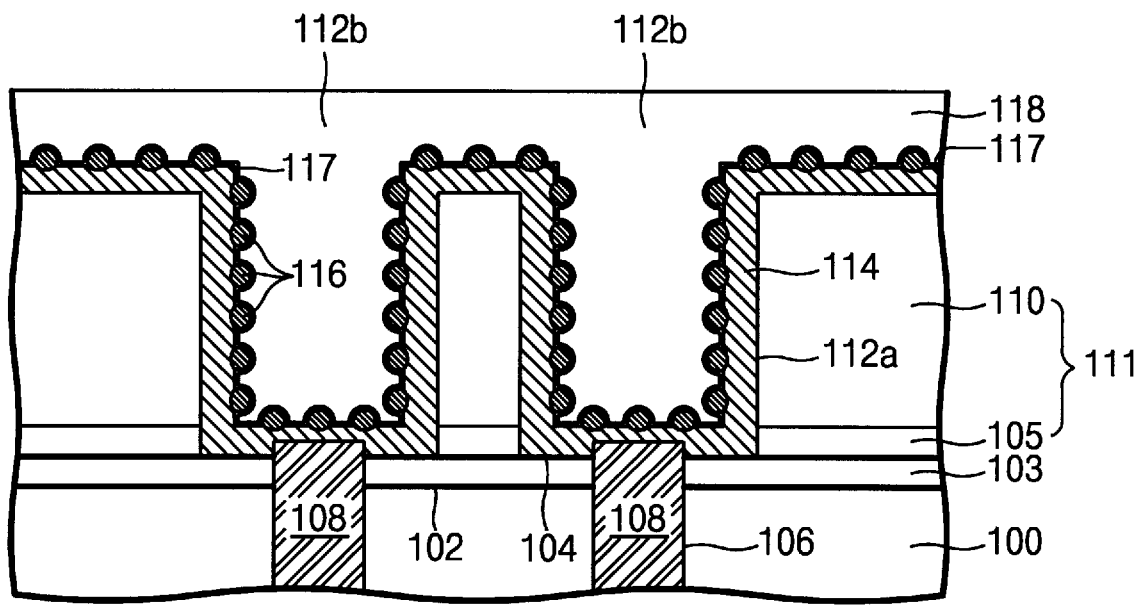

Referring to FIG. 3A, enlarged openings 112a are formed in a moulding layer 111 as in the first embodiment. Referring to FIG. 3B, a conductive layer 114 such as an amorphous silicon layer is deposited for storage nodes in the enlarged openings 112a and on the moulding layer 111. Subsequently, HSG silicon nodules 116 are formed on the conductive layer 114. After formation of the HSG silicon nodules 116, an etch barrier layer 117 is formed on the HSG silicon nodules 116 and the conductive layer 114. The etch barrier layer 117 protects the HSG silicon nodules 116 during a subsequent precleaning process using HF and SC-1 ($NH_3+H_2O_2$+D.I. water) wet chemical and during a subsequent process for removing the moulding layer 111 and a subsequently formed planarization oxide layer 118 (shown in FIG. 3B) with wet chemical. The etch barrier layer 117 is made of a material that has etching selectivity with respect to oxide layers. For example TiN, Ti and SiN can be selected as the material for the etch barrier layer 117.

Figure 3C:
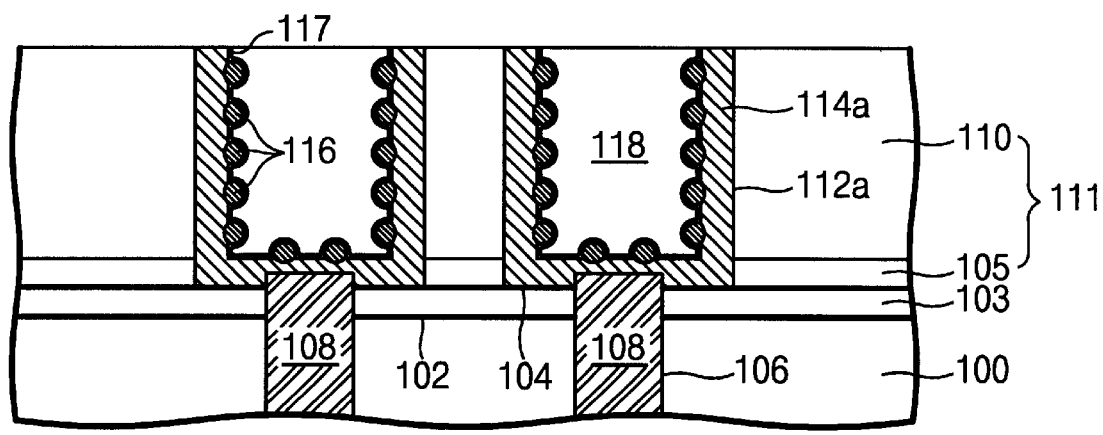
Figure 3D:
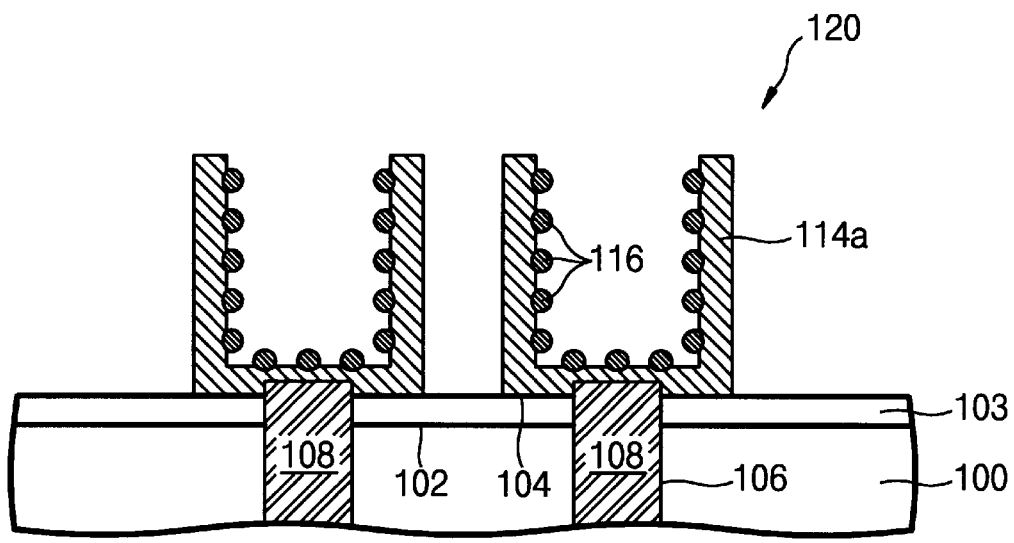

Referring to FIG. 3B, a planarization oxide layer 118 is subsequently deposited to fill the remainder of the openings 112a. Planarization is then carried out for electrical separation as shown in FIG. 3C. The planarization oxide layer 118 and the moulding layer 111 are selectively etched by a wet etchant such as BOE. Due to the presence of the etching barrier layer 117, the HSG silicon is protected from the wet etchant.

Prior to the formation of a dielectric film, a pre-cleaning process using HF and SC-1 ($NH_3+H_2O_2$+D.I. water) wet chemical is carried out. The etching barrier layer 117 also protects the HSG silicon nodules 116 during this pre-cleaning process.

Third embodiment

A third embodiment of the present invention will now be described with reference to FIGS. 4A to 4E. The final structure of a storage node 220 is schematically illustrated in FIG. 4E. Referring to FIG. 4E, the storage node 220 includes HSG silicon nodules 218 formed on the inner and top surfaces of cylinders. Each storage node 220 is embedded in a moulding layer 211 and electrically insulated from one another. The storage node 220 is electrically connected to an active region of an integrated circuit substrate (not shown) via a contact plug 208 in insulating layers 200, 202, 203 and 204. The insulating layers are formed by alternating oxide layers 200, 203 and nitride layers 202, 204. The contact plug 208 protrudes from the top surface of the nitride layer 204. Therefore, the storage node 220, which is formed on the contact plug 208 and on the nitride layer 204 in areas outside the boundary of the contact plug 208, has an increased contact area with the contact plug 208. Thus, contact resistance is reduced and the support of the storage node 220 is reinforced.

Since HSG silicon nodules 218 are formed on the inner surface and top surface of the cylinder and the cylindrical storage node 220 is embedded in the moulding layer 211, an electrical bridge between adjacent storage nodes 220 can be inherently prevented.

The process for forming the cylindrical storage node according to the third embodiment of the present invention will now be described. Same process steps as in the first embodiment is omitted for simplicity.

Figure 4A:
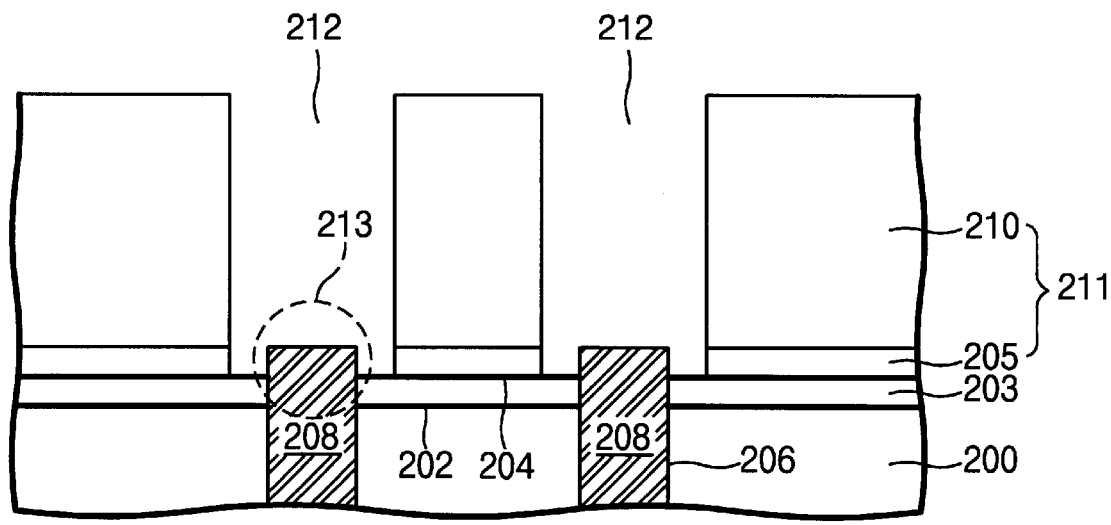
FIGS. 4A to 4E are cross-sectional views of a semiconductor substrate in selected stages of the process steps for forming a DRAM cell capacitor according to a third embodiment of the present invention.
Figure 4B:
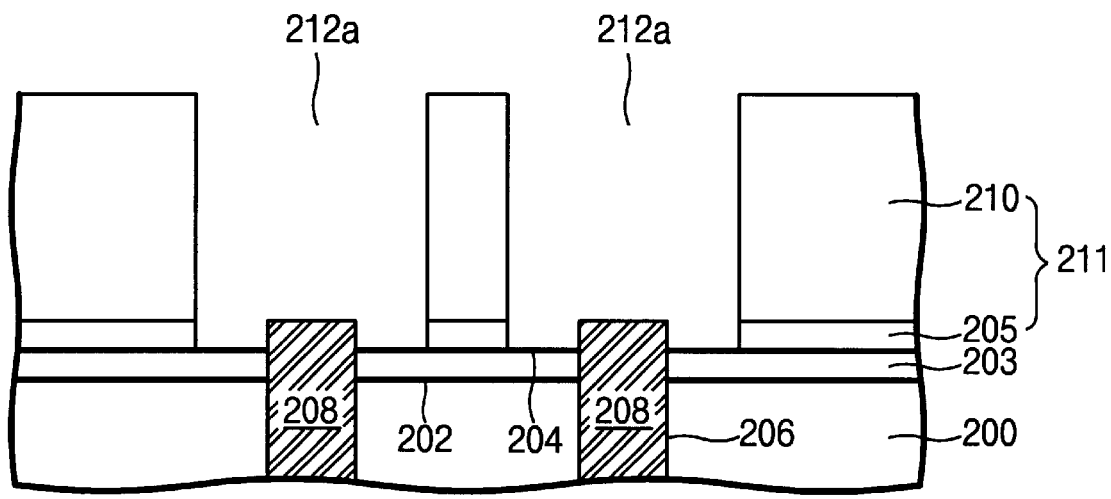

Referring to FIG. 4A, openings 212 are formed in the moulding layer 211, and contact plugs 208 are formed as in the first embodiment. The contact plugs 208 protrude from the top surface of the nitride layer 204 as shown by reference numeral 213 in FIG. 4A. Openings 212 are enlarged by wet etching as shown in FIG. 4B.

Figure 4C:
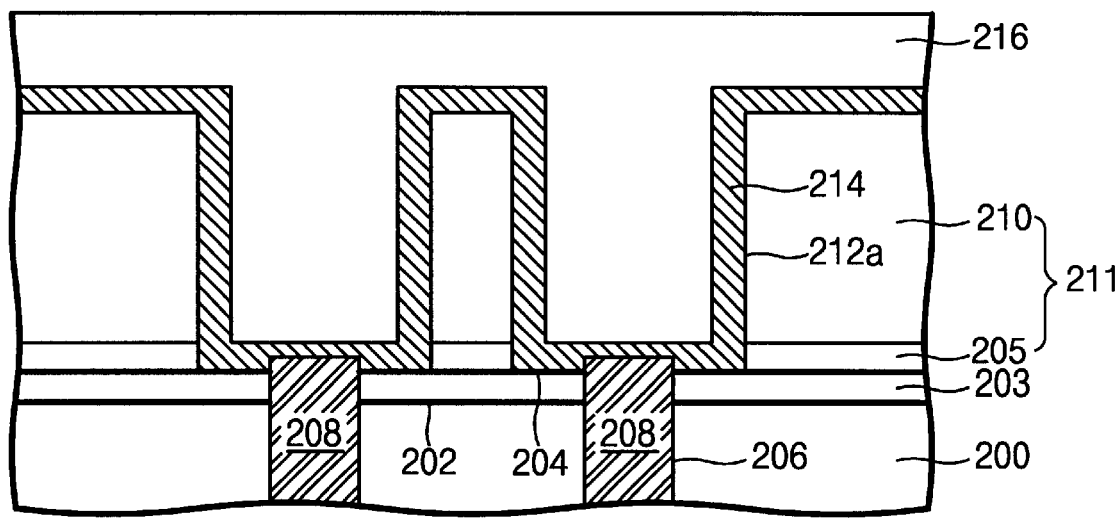

Referring to FIG. 4C, a conductive layer 214 for storage nodes is deposited in the enlarged openings 212a and on the moulding layer 211. A layer 216 of material that has etching selectivity with respect to the conductive layer 214 is deposited on the conductive layer 214 to completely fill the remainder of the openings 212a. For example, a nitride layer may be formed by PECVD (Plasma Enhanced Chemical Vapor Deposition) as the layer 216.

Figure 4D:
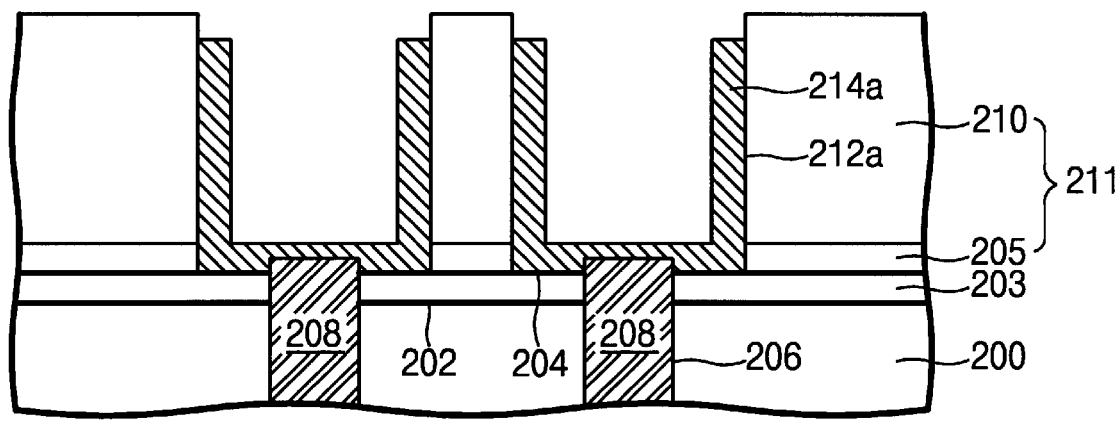
Figure 4E:
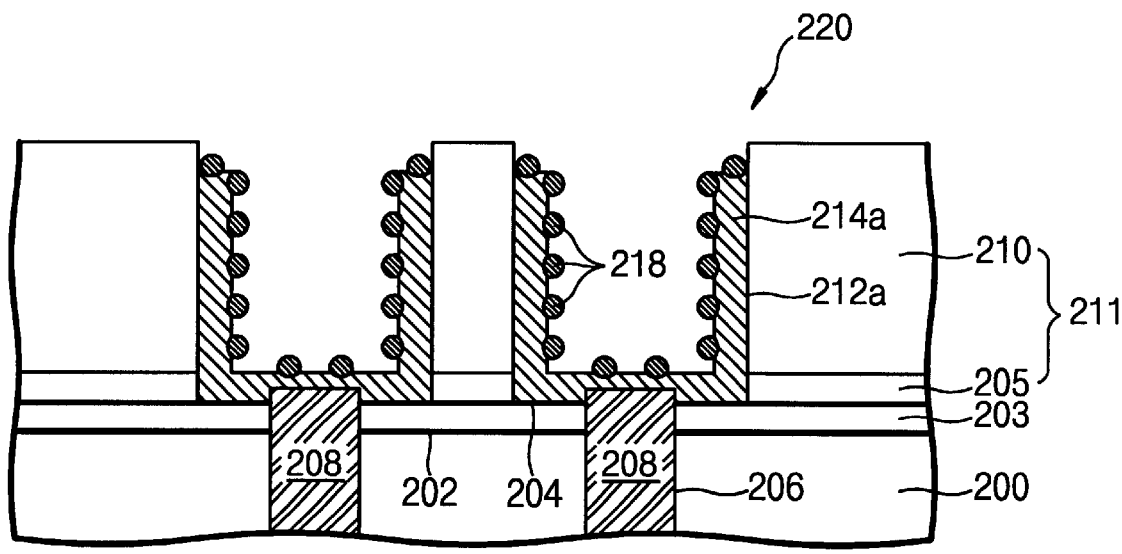

Referring to FIG. 4D, an etch back process is carried out on the nitride layer 216 to expose the top surface of the conductive layer 214 outside the openings 212a. Then, the exposed conductive layer 214 is selectively etched partially for electrical separation by using the nitride layer 216 and the moulding layer 211 as an etch mask. The remainder of the nitride layer 216 in the openings 212a is selectively removed by wet etching technique, thereby forming storage nodes 214a as shown in FIG. 4D.

More specifically, the conductive layer 214 is etched by wet etching technique at least by the thickness of the conductive layer 214, so that the top surface of the storage node 214a is low in level as compared with the level of the top surface of the moulding layer 211. This prevents electrical bridges between adjacent storage nodes 214a during subsequent HSG silicon nodule formation.

Referring to FIG. 4E, HSG silicon nodules 218 are formed on the exposed storage node 214a, thereby completely forming storage nodes embedded in the moulding layer 211. The remaining moulding layer 211 is used as an interlayer insulating layer during the formation of metal contact holes. Then, high concentration PH$_3$ annealing is carried out to dope the HSG silicon. Subsequently, a dielectric film and a plate node are deposited on the resulting structure to finally form a cylindrical capacitor.

Fourth embodiment

The fourth embodiment of the present invention will be described with reference to FIGS. 5A to 5E. The fourth embodiment provides a cylindrical storage node as shown in FIG. 5E.

Figure 5A:
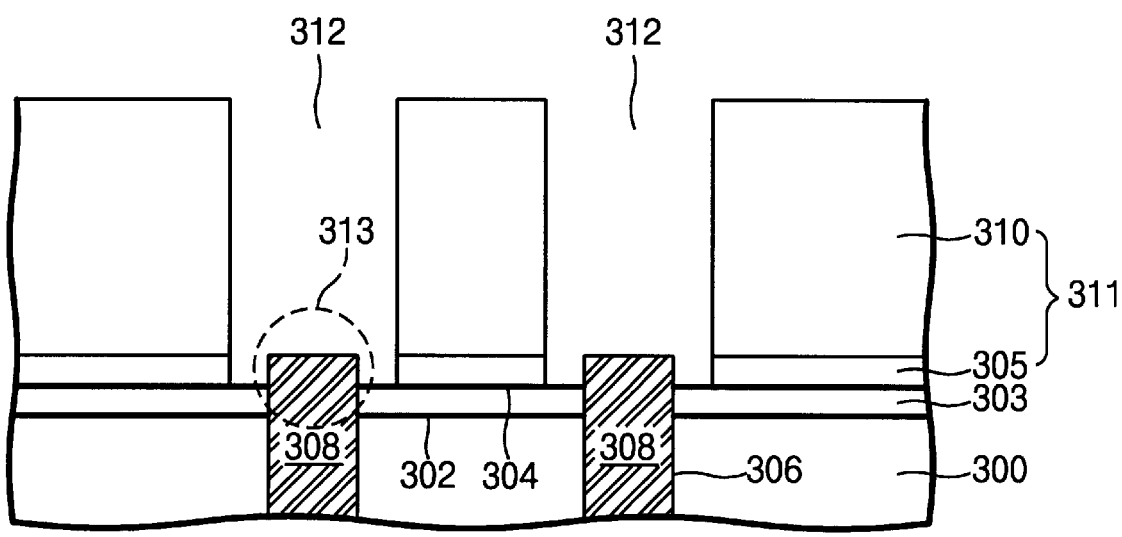
FIGS. 5A to 5E are cross-sectional views of a semiconductor substrate in selected stages of the process steps for forming a DRAM cell capacitor according to a fourth embodiment of the present invention.
Figure 5B:
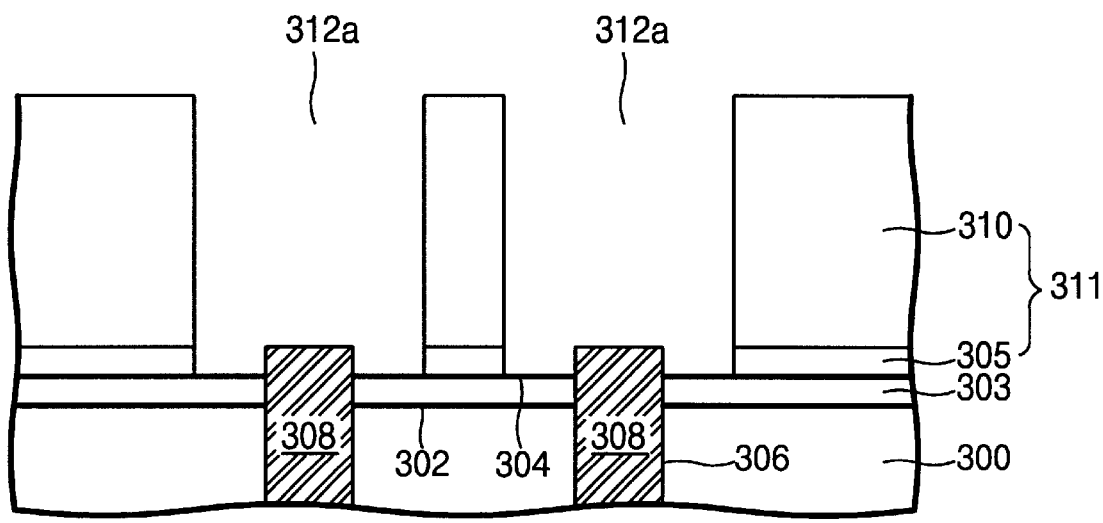
Figure 5C:
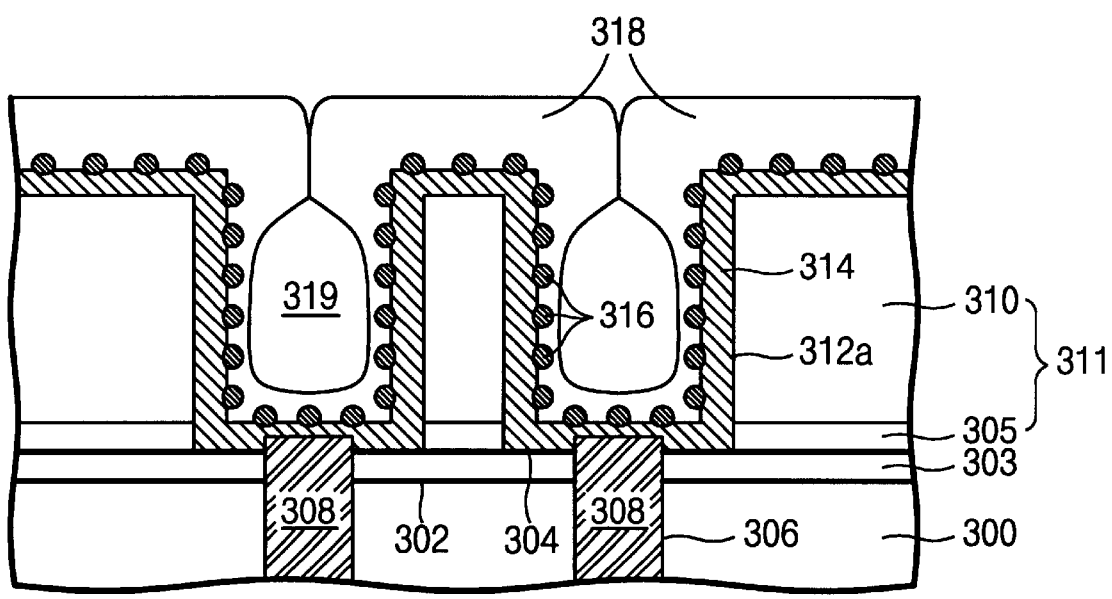
Figure 5D:
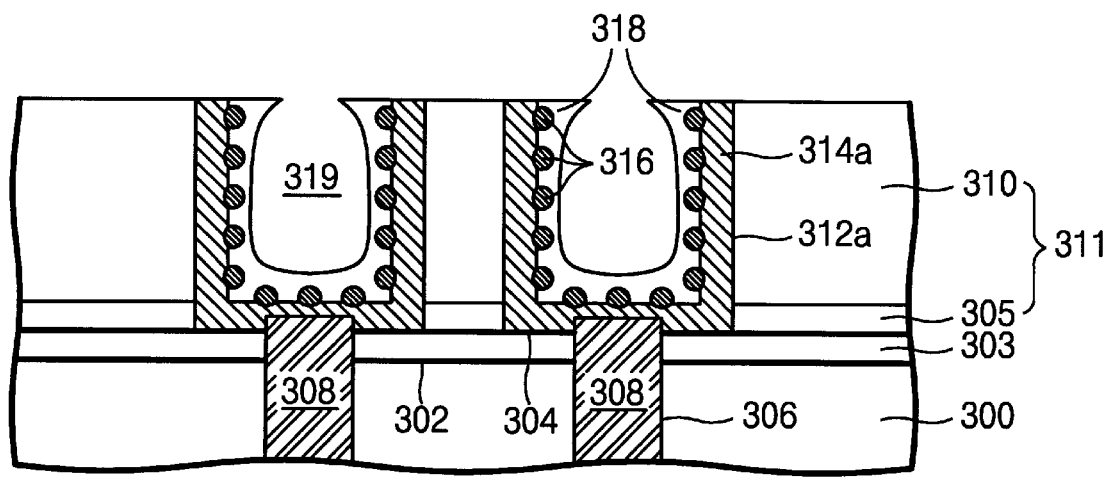
Figure 5E:
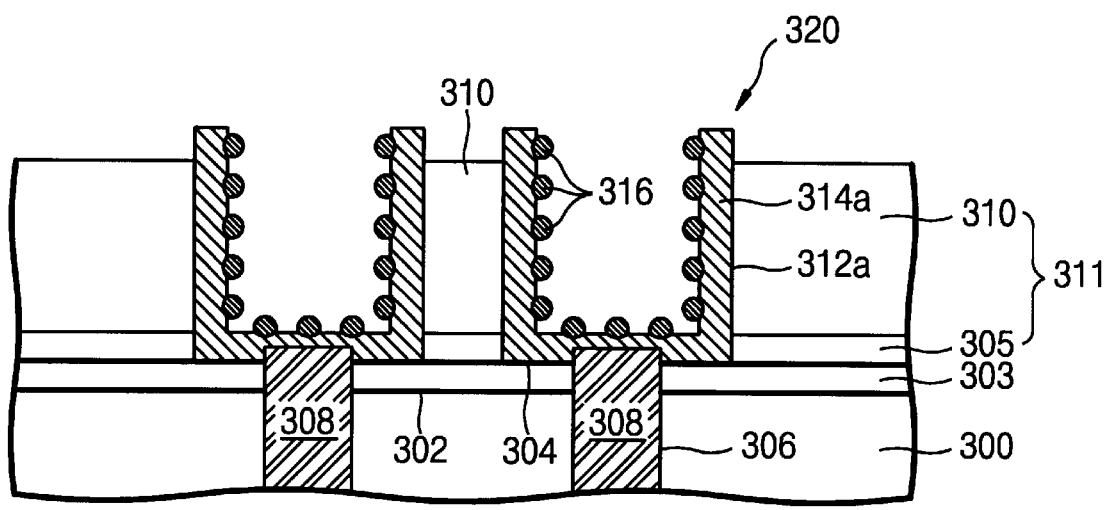

Referring to FIG. 5E, a storage node 320 is embedded in a moulding layer 311, but the height of the storage node 320 is higher in level than the level of the moulding layer 311. HSG silicon nodules 316 are formed only on the inner surface of the cylindrical storage nodes 320. The storage nodes 320 are electrically connected to contact plugs 308.

The process for forming the storage node 320 will now be described with reference to FIGS. 5A to 5E. The same process steps as in the first and third embodiments are omitted for simplicity.

Referring to FIG. 5A, openings 312 for storage nodes are formed in a moulding layer 311 to expose contact plugs 308. Wet etching is carried out to enlarge the openings 312, resulting in enlarged openings 312a, as shown in FIG. 5B.

Referring to FIG. 5C, a conductive layer 314 is then deposited in the enlarged openings 312a and on the moulding layer 311. HSG silicon nodules 316 are formed on the conductive layer 314. A planarization oxide layer 318 such as PE-TEOS is then deposited in the remainder of the openings 312a. The deposition of the oxide layer 318 is carefully controlled to form voids 319 therein as shown in FIG. 5C. This decreases the amount of oxide layer to be etched during a subsequent etching process.

Referring to FIG. 5D, a planarization process such as CMP is carried out down to the top surface of the moulding layer 311. Referring to FIG. 5E, the remainder of the oxide layer 318 in the openings 312a is etched by wet etching to form storage nodes 320. During this step of wet etching the oxide layer 318, the moulding layer 311 is partially etched at the same time, thereby reducing the height of the moulding layer 311. Because the remaining moulding layer 311 is used as an interlayer insulating layer for metal contact formation, the aspect ratio of contact can be reduced.

Then, high concentration PH$_3$ annealing is carried out to dope the HSG silicon. Subsequently, a dielectric film and a plate node are formed on the resulting structure, thereby forming a cylindrical capacitor.

Fifth embodiment

Figure 6A:
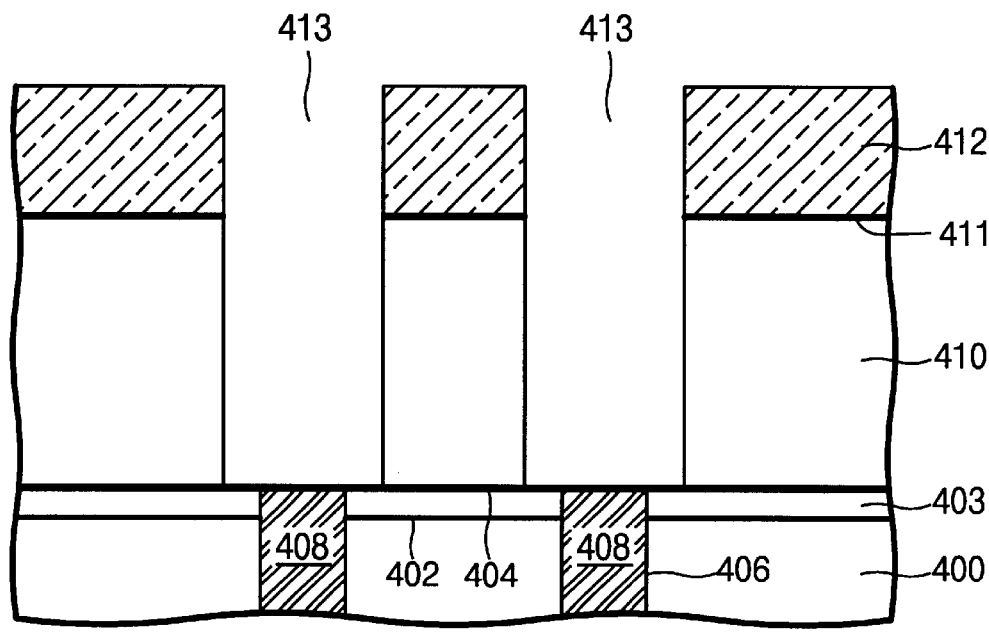
FIGS. 6A to 6E are cross-sectional views of a semiconductor substrate in selected stages of the process steps for forming a DRAM cell capacitor according to a fifth embodiment of the present invention.

The fifth embodiment of the present invention will now be described with reference to FIGS. 6A to 6E. Referring to FIG. 6A, an insulating layer 400, a silicon nitride layer 402, an oxide layer 403 and a first anti-reflective coating layer 404 are sequentially formed on an integrated circuit substrate (not shown). Although not shown, bit lines are already formed in the insulating layer 400. The nitride layer 402 serves to prevent oxidation of the bit lines and is about 50 Å to 100 Å thick. For example, the nitride layer 402 is about 70 Å thick. Preferably, the oxide layer 403 is made of PT-TEOS and is about 500 Å thick. The first anti-reflection layer 404 is made of SiON (Silicon Oxynitride) and may have a thickness of about 100 Å to 1,000 Å. For example, the anti-reflection layer 404 is about 260 Å thick.

Contact holes 406 are opened in the first anti-reflection layer 404, the oxide layer 403, the nitride layer 402 and the interlayer insulating layer 400. The contact holes 406 are filled with conductive material such as TiN, Ti, W, WSi$_x$ and/or a combination thereof. Then, a planarization process such as an etch back process is carried out to form contact plugs 408.

A moulding layer 410 is deposited on the first anti-reflection layer 404 and on the contact plugs 408 with a thickness exceeding the desired height of the storage nodes. For example, the moulding layer 410 is made of a PE-TEOS oxide layer and has a thickness of about 9,000 Å. A second anti-reflection layer 411 is formed on the moulding layer 410. The second anti-reflection layer 411 is made of SiON and may have a thickness of about 100 Å to 1,000 Å. For example, the second anti-reflection layer 411 is about 260 Å thick.

A mask pattern 412 such as a photoresist pattern of a 170 nm design rule is formed on the second anti-reflection layer 411. Using the mask pattern 412, the second anti-reflection layer 411 and the moulding oxide layer 410 are etched until the surface of the first anti-reflection layer 404 is exposed, thereby forming openings 413 for storage node formation. After removing the mask pattern 412 by conventional ashing and stripping processes, the second anti-reflection layer 411 is removed. Also, the exposed first anti-reflection layer 404 is removed at the same time, thus exposing the underlying oxide layer 403.

Figure 6B:
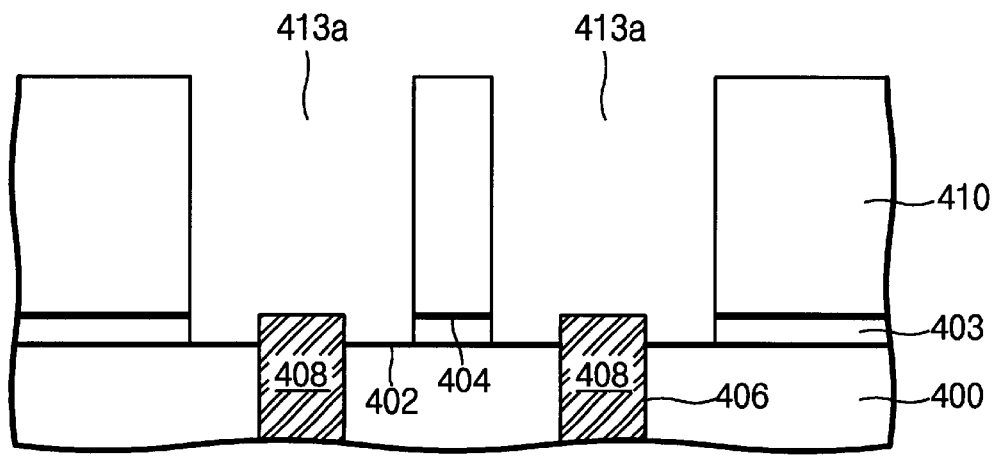

Referring to FIG. 6B, both sidewalls of the openings 413 are partially etched to enlarge the dimensions thereof, resulting in enlarged openings 413a. The sidewalls of the openings 413 are etched by a at least the same as the thickness of a subsequently formed conductive layer for storage nodes by a wet etching process. Therefore, the distance between the adjacent openings defined by the mask pattern can be reduced. That is, a fine pitch exceeding the design rule can be obtained. The distance between the adjacent openings can be reduced to about 10 nm.

Figure 6C:
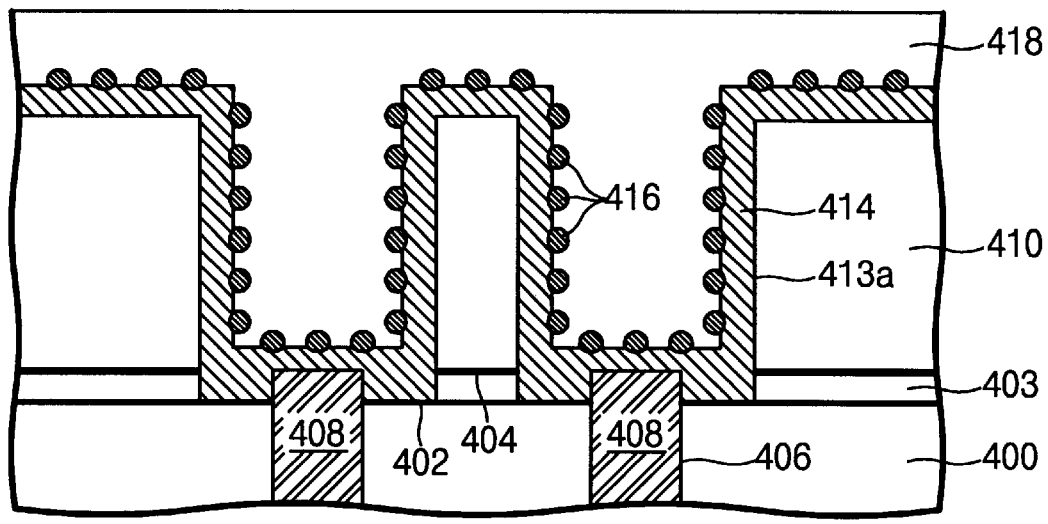

Referring to FIG. 6C, a conductive layer 414 for storage node formation is deposited with a thickness of about 500 Å. HSG silicon nodules 416 with a thickness of about 300 Å or more are then formed on the conductive layer 414. A planarization oxide layer 418 such as PE-TEOS is deposited to completely fill the remainder of the openings 413a, for example, with a thickness of 200 nm or more.

Figure 6D:
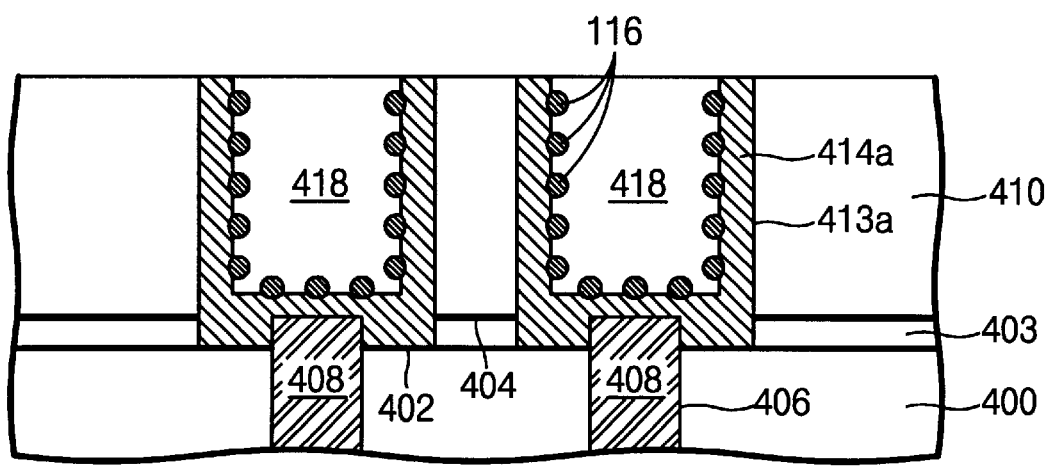

Referring to FIG. 6D, a planarization process such as CMP is carried out down to the top surface of the moulding oxide layer 410 for electrical separation of each storage node.

Figure 6E:
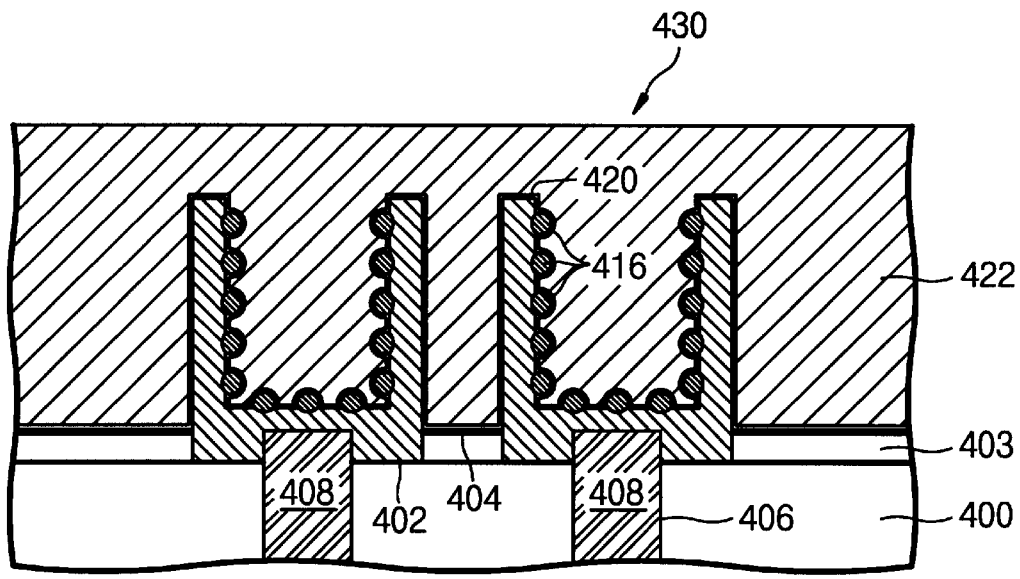

Referring to FIG. 6E, the remaining planarization oxide layer 418 in the openings 413a and the remaining moulding oxide layer 410 outside the openings 413a are selectively etched by using the first anti-reflection layer 404 as an etch-stop layer, thereby forming storage nodes 414a having HSG silicon nodules 416 on the inner surface thereof. After high concentration $PH_3$ annealing for doping the HSG silicon, a dielectric film 420 and a plate node 422 are formed on the resulting structure to form cylindrical capacitors 430. The dielectric film 420 is made of a NO (Nitride Oxide) layer with a thickness of about 8 nm to 10 nm, and the plate node 422 is about 135 nm thick.

As in the second embodiment, an etching barrier layer (not shown) may be further formed on the HSG silicon nodules 416a prior to the formation of the planarization oxide layer 418 in order to protect the HSG silicon nodules during a subsequent cleaning process.

Sixth embodiment

The sixth embodiment of the present invention will be described with reference to FIGS. 7A to 7E. An interlayer insulating layer 500, a silicon nitride layer 502, and a first anti-reflection layer 503 are sequentially formed on an integrated circuit substrate (not shown). Although not shown in the drawings, bit lines are already formed in the interlayer insulating layer 500. The silicon nitride layer 502 is formed by PECVD and is about 30 nm to 100 nm thick, preferably 100 nm thick. The silicon nitride layer 502 is provided to protect the bit lines from subsequent oxidation processes. The first anti-reflection layer 503 is made of SiON and may be about 10 nm to 100 nm thick. For example, the first anti-reflection layer 503 is about 26 nm thick.

Contact holes 504 are formed in the insulating layers 500, 502 and 503 by conventional photolithographic etching processes. Conductive material filling the contact holes 504 comprises TiN, Ti, W, WSi and/or all combinations thereof.

Subsequently, a planarization process such as an etch back process is carried out to form contact plugs 506.

An oxide layer 508 as a moulding layer for storage nodes is deposited on the contact plugs 506 and the first anti-reflection layer 503 with a thickness exceeding the height of the desired storage nodes. For example, a PE-TEOS oxide layer may be formed as the moulding layer 508 with a thickness of about 10,000 Å.

A second anti-reflection layer 509 is formed on the moulding layer 508. The second anti-reflection layer 509 is made of SiON and may have a thickness in the range of 10 nm to 100 nm. For example, the second anti-reflection layer 509 is about 26 nm thick. Using a mask pattern 510, the second anti-reflection layer 509 and the moulding layer 508 are etched to form openings 512 that expose the top surface of the first anti-reflection layer 503.

Figure 7A:
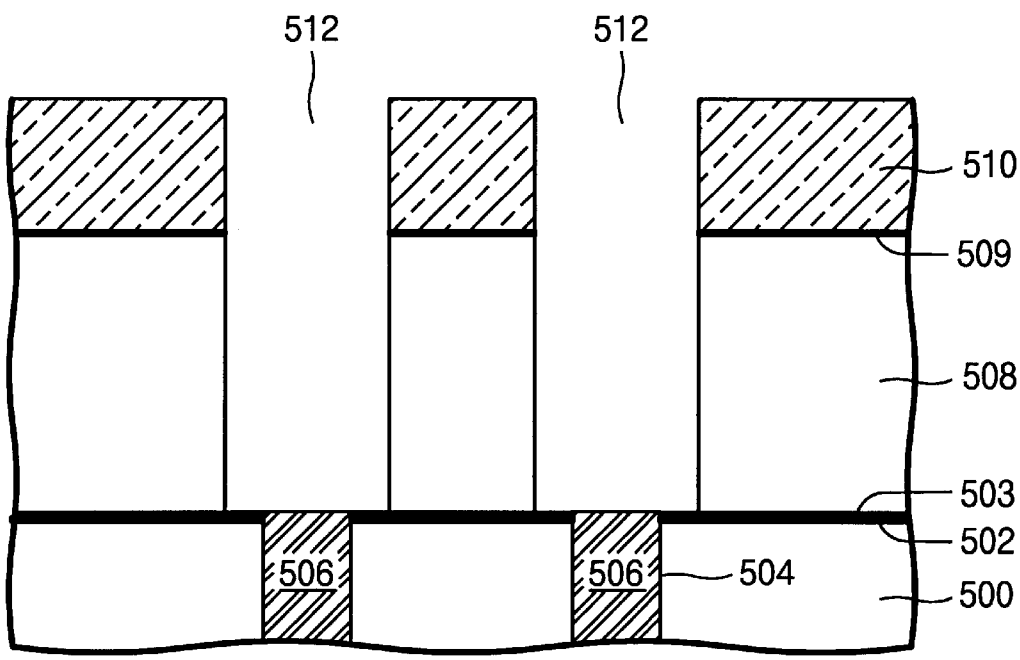
FIGS. 7A to 7E are cross-sectional views of a semiconductor substrate in selected stages of the process steps for forming a DRAM cell capacitor according to a sixth embodiment of the present invention.
Figure 7B:
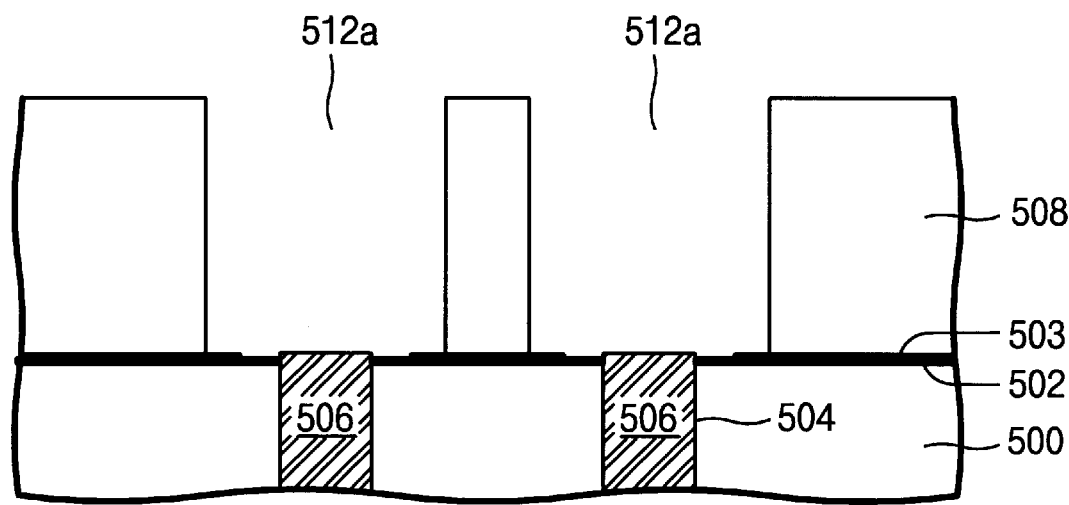

Referring to FIG. 7B, both sidewalls of the opening 512 are partially etched to enlarge the dimension of the opening 512, resulting in enlarged openings 512a. The sidewalls of the openings 512 (FIG. 7A) are etched by a thickness at least the same as the thickness of a subsequently formed conductive layer for storage nodes by a wet etching process. Therefore, the distance between the adjacent openings defined by the mask pattern can be reduced. That is, a fine pitch exceeding the design rule can be obtained. The distance between the adjacent openings can be reduced to about 10 nm.

Figure 7C:
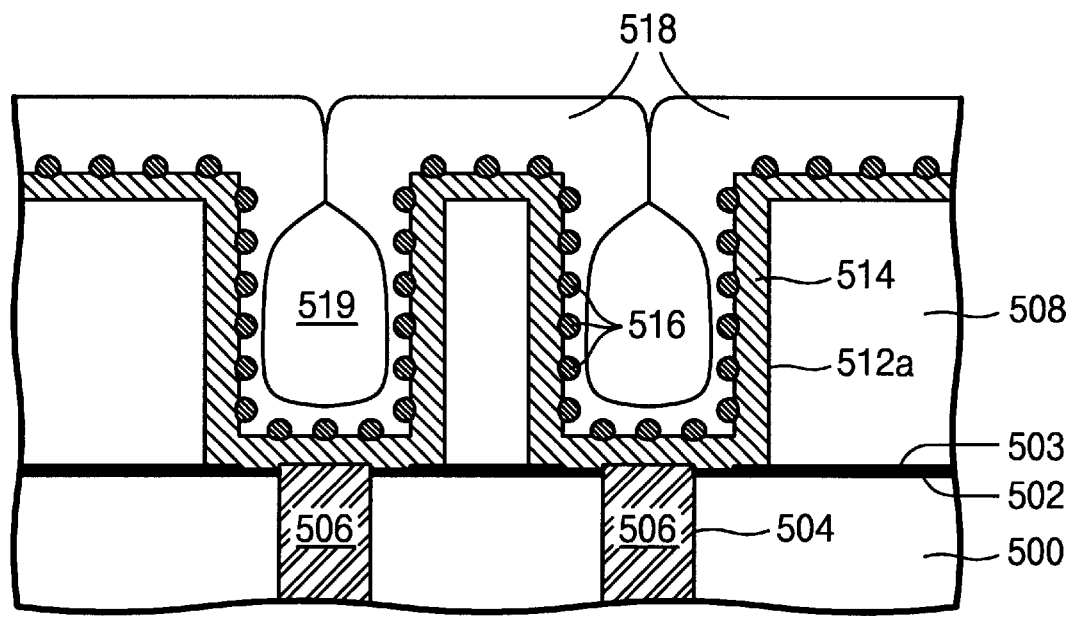

Referring to FIG. 7C, a conductive layer 514 for storage node formation is deposited with a thickness of about 400 Å to 500 Å. The conductive layer 514 is made of amorphous silicon. HSG silicon nodules 516 with a thickness of about 300 Å or more are then formed on the conductive layer 514. A planarization oxide layer 518 made of a material such as PE-TEOS is deposited to completely fill the remainder of the openings 512a, for example, with a thickness of 200 nm or more. The deposition of the planarization oxide layer 518 is carefully controlled to form voids 519 therein as shown in FIG. 7C. This decreases the amount of the planarization oxide layer 518 to be etched.

Figure 7D:
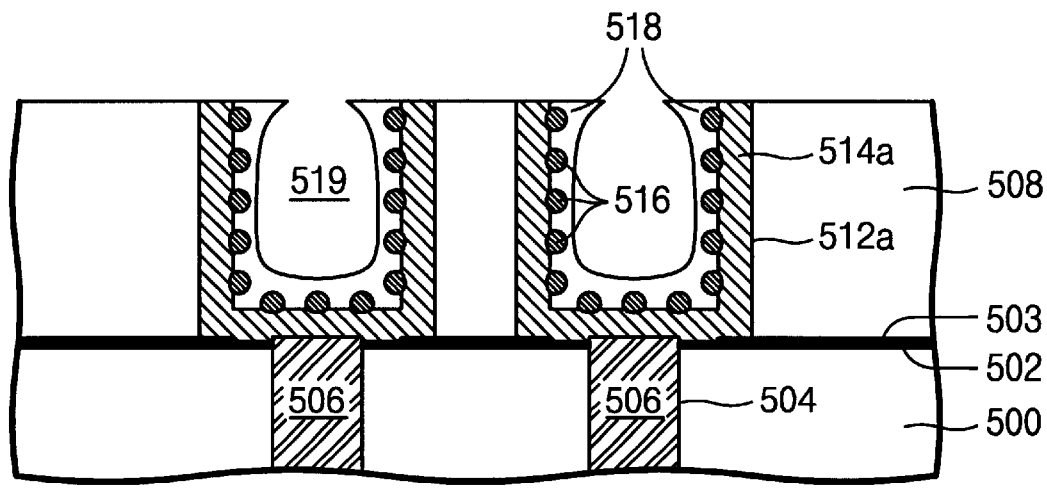

Referring to FIG. 7D, a planarization process such as CMP is carried out until the top surface of the moulding layer 508 is exposed. The remainder of the oxide layer 518 in the openings 512a is removed to form storage nodes. During this step of removing the oxide layer 518, the moulding layer 508 is partially etched concurrently, thereby reducing the height thereof. Since the remaining moulding layer 508 is used as an interlayer insulating layer for metal contact formation, the aspect ratio of contact can be reduced.

Figure 7E:
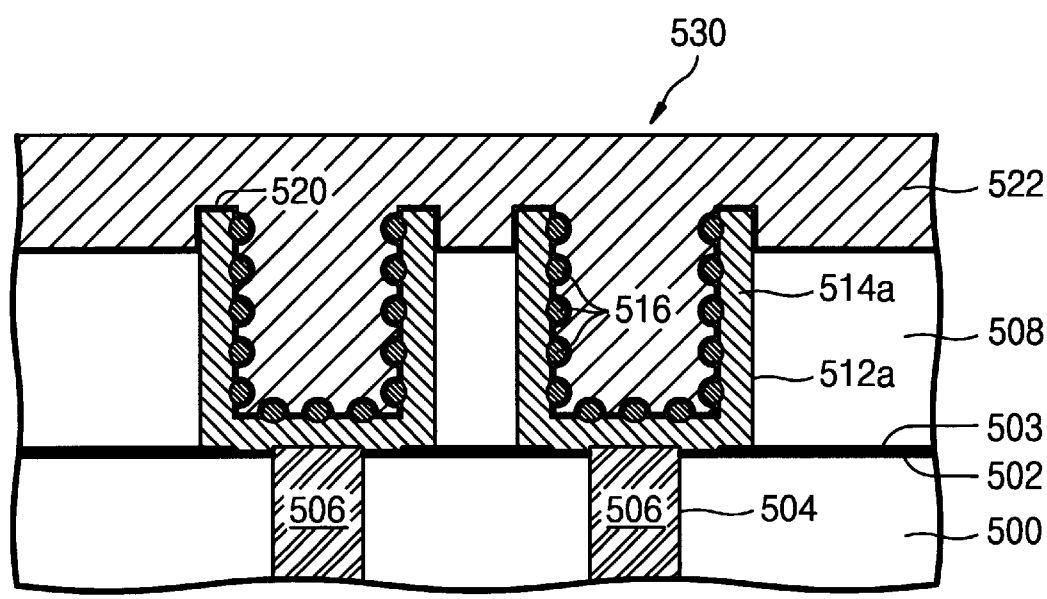

Subsequently, high concentration $PH_3$ annealing is carried out to dope the HSG silicon. Then, a dielectric film 520 and a plate node 522 are formed on the resulting structure, thereby forming a capacitor 530 as shown in FIG. 7E.

The dielectric film 522 is a NO (Nitride Oxide) layer with a thickness of about 8 nm to 10 nm. The plate node 522 is made of polysilicon and is about 135 nm thick.

While the present invention is susceptible to various modifications and alternative forms, specific embodiments have been shown by way of example in the drawings and described in detail herein. However, it should be understood that the invention is not limited to the particular forms disclosed. Rather, the invention covers all modifications equivalents, and alternatives falling within the spirit and scope of the invention as defined in the appended claims.

What is claimed is:

1. A method for fabricating a DRAM (Dynamic Random Access Memory) cell capacitor, comprising the steps of:

forming a moulding layer on an integrated circuit substrate, the moulding layer having an opening for a storage node;

enlarging the opening by etching both sidewalls of the opening by a predetermined thickness;

forming a conductive layer for the storage node in the enlarged opening and on the moulding layer;

forming an insulating layer on the conductive layer to completely fill the enlarged opening; and planarizing the insulating layer and the conductive layer until the top surface of the moulding layer is exposed.

2. The method according to claim 1, wherein the step of enlarging the opening comprises wet-etching the moulding layer by a thickness at least the same as that of the conductive layer so that a minimum distance between adjacent openings is reduced to about 10 nm.

3. The method according to claim 1, further comprising the steps of:

forming HSG silicon nodules on the conductive layer prior to the step of forming the insulating layer;

removing at least the remainder of the insulating layer in the enlarged opening subsequent to the step of planarizing the insulating layer to form a storage node; and forming a dielectric layer and a plate node to form the capacitor.

4. The method according to claim 1, further comprising the steps of:

removing the insulating layer in the enlarged opening subsequent to the step of planarizing the insulating layer and the conductive layer;

forming HSG silicon nodules on the storage node; and forming a dielectric layer and a plate node to form a capacitor.

5. The method according to claim 4, further comprising the step of removing the moulding layer subsequent to the step of forming the HSG silicon nodules.

6. A method for fabricating a DRAM cell capacitor, comprising the steps of:

forming a first insulating layer on an integrated circuit substrate;

selectively etching the first insulating layer to form a contact hole;

filling the contact hole with conductive material to form a contact plug;

forming a moulding layer on the first insulating layer and on the contact plug, the moulding layer having an opening that exposes at least a top surface of the contact plug and a part of the first insulating layer outside the boundary of the contact plug;

enlarging the opening by etching both sidewalls of the opening by a predetermined thickness;

forming a conductive layer in the enlarged opening and on the moulding layer;

forming HSG silicon nodules on the conductive layer;

forming a second insulating layer on the HSG silicon nodules and on the conductive layer to completely fill the enlarged opening; and planarizing the second insulating layer, the HSG silicon nodules and the conductive layer until the surface of the moulding layer is exposed.

7. The method according to claim 6, wherein the first insulating layer at least includes a nitride layer and an oxide layer on the integrated circuit substrate in this order, the opening in the moulding layer is formed by etching the moulding layer and a portion of the first insulating layer by using the nitride layer of the first insulating layer as an etching stopper, and the contact plug protrudes from the top surface of the etching stopper nitride layer.

8. The method according to claim 6, wherein the step of enlarging the opening comprises wet etching the moulding layer by at least a thickness same as that of the conductive layer, the opening being enlarged such that a minimum distance from adjacent openings is reduced to about 10 nm.

9. The method according to claim 6, further comprising the step of forming an etching barrier layer on the HSG silicon nodules prior to the step of forming the second insulating layer in order to protect the HSG silicon nodules.

10. The method according to claim 6, further comprising the steps of removing at least the remainder of the second insulating layer in the enlarged opening; and sequentially forming a dielectric film and a plate node to form a capacitor.

11. A method for fabricating a DRAM cell capacitor, comprising the steps of:

forming a first insulating layer on an integrated circuit substrate;

selectively etching the first insulating layer to form a contact hole;

filling the contact hole with conductive material to form a contact plug;

forming a moulding layer on the first insulating layer and on the contact plug, the moulding layer having an opening that exposes at least a top surface of the contact plug and the first insulating layer outside the boundary of the contact plug;

enlarging the opening by etching both sidewalls of the opening by a predetermined thickness;

forming a conductive layer in the enlarged opening and on the moulding layer;

forming a second insulating layer on the conductive layer to completely fill the enlarged opening, the second insulting layer having an etching selectivity with respect to the moulding layer;

planarizing the second insulating layer and the conductive layer until the surface of the moulding layer is exposed;

removing the remainder of the second insulating layer in the enlarged opening to form a storage node; and forming HSG silicon nodules on the surface of the storage node.

12. The method according to claim 11, wherein the first insulating layer at least includes a nitride layer and an oxide layer on the integrated circuit substrate in this order, the opening in the moulding layer is formed by etching the moulding layer and a portion of the first insulating layer by using the nitride layer of the first insulating layer as an etching stopper, and the contact plug protrudes from the top surface of the etching stopper nitride layer.

13. The method according to claim 11, wherein the step of enlarging the opening comprises wet etching the moulding layer by at least a thickness same as that of the conductive layer, the opening being enlarged such that a minimum distance from adjacent openings is reduced to about 10 nm.

14. The method according to claim 11, further comprising the steps of:

removing the moulding layer subsequent to the step of forming HSG silicon nodules; and sequentially forming a dielectric film and a plate node to form a capacitor.

15. A method for fabricating a DRAM cell capacitor, comprising the steps of:

forming a first insulating layer on an integrated circuit substrate;

selectively etching the first insulating layer to form a contact hole;

filling the contact hole with conductive material to form a contact plug;

forming a moulding layer on the first insulating layer and on the contact plug, the moulding layer having an opening that exposes at least the top surface of the contact plug and the first insulating layer outside the boundary of the contact plug;

enlarging the opening by etching both sidewalls of the opening by a predetermined thickness;

forming a conductive layer in the enlarged opening and on the moulding layer;

forming HSG silicon nodules on the conductive layer;

forming a second insulating layer in the remainder of the enlarged opening and on the conductive layer, a void being formed in the enlarged opening when forming the second insulating layer; and planarizing the second insulating layer, the HSG silicon nodules and the conductive layer until the surface of the moulding layer is exposed.

16. The method according to claim 15, wherein the first insulating layer at least includes a nitride layer and an oxide layer on the integrated circuit substrate in this order, the opening in the moulding layer is formed by etching the moulding layer and a portion of the first insulating layer by using the nitride layer of the first insulating layer as an etching stopper, and the contact plug protrudes from the top surface of the etching stopper nitride layer.

17. The method according to claim 15, wherein the step of enlarging the opening comprises wet etching the moulding layer by at least a thickness same as that of the conductive layer, the opening being enlarged such that a minimum distance from adjacent openings is reduced to about 10 mn.

18. The method according to claim 15, further comprising the steps of:

removing at least the remainder of the second insulating layer in the enlarged opening; and sequentially forming a dielectric film and a plate node to form a capacitor.

19. A method for fabricating a DRAM cell capacitor, comprising the steps of:

forming a first insulating layer and a first anti-reflection layer on an integrated circuit substrate;

selectively etching the first anti-reflection layer and the first insulating layer to form a contact hole;

filling the contact hole with a conductive material to form a contact plug;

forming a moulding layer and a second anti-reflection layer on the first anti-reflection layer and on the contact plug;

etching the second anti-reflection layer and the moulding layer to form an opening that exposes at least the top surface of the contact plug and the first anti-reflection layer outside the boundary of the contact plug;

removing at least the second anti-reflection layer and the first anti-reflection layer in the opening;

enlarging the opening by etching both sidewalls of the opening by a predetermined thickness;

forming a conductive layer in the enlarged opening and on the moulding layer;

forming HSG silicon nodules on the conductive layer;

forming a second insulating layer to completely fill the enlarged opening; and planarizing the second insulating layer, the HSG silicon nodules and the conductive layer until the surface of the moulding layer is exposed.

20. The method according to claim 19, wherein the step of enlarging the opening comprises wet etching the moulding layer by at least a thickness same as that of the conductive layer, the opening being enlarged such that a minimum distance from adjacent openings is reduced to about 10 nm.

21. The method according to claim 19, further comprising the step of forming an etching barrier layer on the HSG silicon nodules prior to the step of forming the second insulating layer in order to protect the HSG silicon nodules.

22. The method according to claim 19, further comprising the steps of:

removing at least the second insulating layer in the enlarged opening subsequent to the step of planarizing the second insulating layer; and sequentially forming a dielectric film and a plate node to form a capacitor.

23. A method for fabricating a DRAM cell capacitor, comprising the steps of:

forming a first insulating layer and a first anti-reflection layer on an integrated circuit substrate;

selectively etching the first anti-reflection layer and the first insulating layer to form a contact hole;

filling the contact hole with conductive material and to form a contact plug;

forming a moulding layer and a second anti-reflection layer on the first anti-reflection layer and on the contact plug;

etching the second anti-reflection layer and the moulding layer to form an opening that exposes at least the top surface of the contact plug and the first anti-reflection layer outside the boundary of the contact plug;

removing at least the second anti-reflection layer and the first anti-reflection layer in the opening;

enlarging the opening by etching both sidewalls of the opening by a predetermined thickness;

forming a conductive layer in the enlarged opening and on the moulding layer;

forming HSG silicon nodules on the conductive layer;

forming a second insulating layer in the remainder of the enlarged opening and on the conductive layer, a void being formed in the enlarged opening when forming the second insulating layer; and planarizing the second insulating layer, the HSG silicon nodules and the conductive layer until the surface of the moulding layer is exposed.

24. The method according to claim 23, wherein the step of enlarging the opening comprising wet etching the moulding layer by at least a thickness same as the that of the conductive layer, the opening being enlarged such that a minimum distance from adjacent openings is reduced to about 10 nm.

25. The method according to claim 23, further comprising the steps of:

removing at least the remainder of the second insulating layer in the enlarged opening subsequent to the step of planarizing the second insulating layer, the HSG silicon nodules and the conductive layer; and sequentially forming a dielectric film and a plate node to form a capacitor.

26. The method according to claim 25, wherein the top surface of the moulding layer is low in level as compared to the top surface of the planarized conductive layer.

* * * * *